United States Patent [19]
Lee et al.

[11] Patent Number: 5,708,607
[45] Date of Patent: Jan. 13, 1998

[54] DATA READ CIRCUIT OF A MEMORY

[75] Inventors: Sang Hyun Lee, Kyungki-do; Ha Min Sung, Seoul, both of Rep. of Korea

[73] Assignee: LG Semicon Co., Ltd., Chungcheongbuk-Do, Rep. of Korea

[21] Appl. No.: 724,886

[22] Filed: Oct. 3, 1996

[30] Foreign Application Priority Data

Dec. 5, 1995 [KR] Rep. of Korea ............ 46858/1995

[51] Int. Cl.$^6$ ............................................. G11C 7/00
[52] U.S. Cl. ............ 365/189.05; 365/207; 365/189.01
[58] Field of Search ........................ 365/54, 189.05, 365/207, 208, 189.01

[56] References Cited

U.S. PATENT DOCUMENTS

5,126,974  6/1992  Sasaki et al. ................ 315/54
5,563,835  10/1996  Oldham ..................... 365/189.05

Primary Examiner—David C. Nelms
Assistant Examiner—F. Niranjan
Attorney, Agent, or Firm—Finnegan, Henderson, Farabow, Garrett & Dunner, L.L.P.

[57] ABSTRACT

A data read circuit of a memory includes an inverting unit, a precharging unit, a first amplifying unit, a second amplifying unit, and an output buffer unit. The inverting unit inverts data from a sense amplifier, and the precharging unit precharges a data bus line to Vcc/2. The first amplifying unit receives and amplifies the inverted data, and the second amplifying unit is commonly connected to an input terminal of the first amplifying unit to receive and amplify the signal output from the inverting unit. The output buffer unit receives, inverts and outputs the signal amplified by the first and second amplifying units.

9 Claims, 5 Drawing Sheets

DATA READ CIRCUIT OF A MEMORY

BACKGROUND OF THE INVENTION

The present invention relates to a data read circuit of a memory having an improved access time. More particularly, it relates to a data read circuit that reduces the delay that may occur during a read mode.

Figure 1:
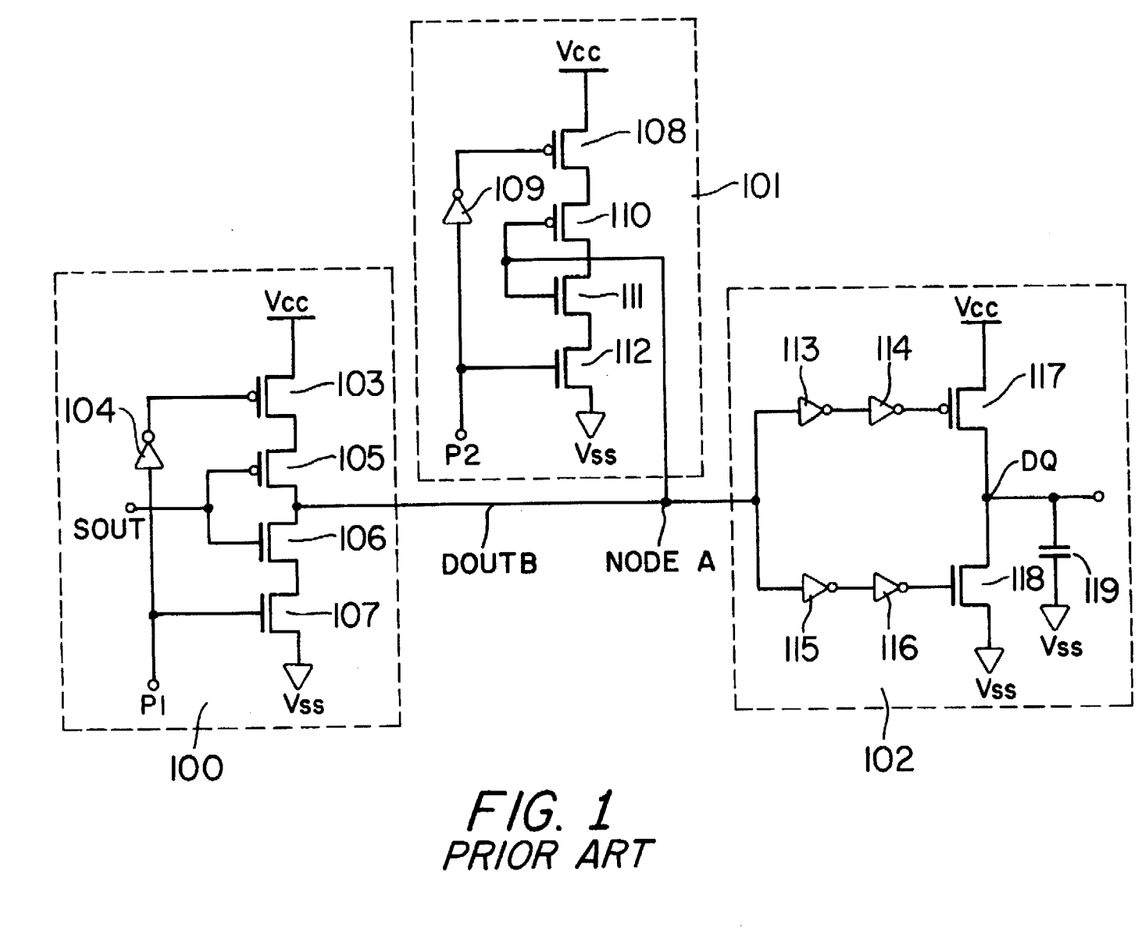
FIG. 1 is a schematic block diagram of a conventional data read circuit of a memory.

As shown in FIG. 1, a conventional data read circuit of a semiconductor memory includes an inverter 100 to invert address data from a sense amplifier (not shown) in response to a control signal appearing at control terminal P1. A precharging unit 101 is further provided that receives a signal produced from inverter 100 and precharges a data bus line DOUTB to half the power supply voltage Vcc in response to a signal appearing at control terminal P2. Further, output buffer unit 102 receives data produced from precharging unit 101 and generates amplified output data.

The inverter 100 includes P type MOS transistor 103 having a source electrode coupled to power voltage Vcc, a gate electrode connected to an output terminal of inverter 104, and a drain electrode connected to a source electrode of a P type MOS transistor 105. In addition, P type MOS transistor 105 of inverter 100 has a source electrode connected to the drain electrode of P type MOS transistor 103, a gate electrode connected in common to a gate electrode of an N type MOS transistor 106, an output terminal SOUT of a sense amplifier, and a drain electrode connected to a drain electrode of N type MOS transistor 106. Further, N type MOS transistor 106 has its drain electrode connected to the drain electrode of P type MOS transistor 105, its gate electrode connected to the gate electrode of the P type MOS transistor 105, and its source electrode connected to a drain electrode of N type MOS transistor 107.

Inverter 100 further includes N type MOS transistor 107 having a drain electrode connected to the source electrode of N type MOS transistor 106, a gate electrode connected to an input terminal of inverter 104, and a source electrode connected to a common electric potential. Further, inverter 104 has an input terminal connected to a control terminal, chip enable terminal P1, and an output terminal connected to the gate terminal of P type MOS transistor 103.

A precharging unit 101 is also provided which includes a P type MOS transistor 108 having a source electrode receiving the power supply voltage, a gate electrode connected to an output terminal of inverter 109, and a drain electrode connected to a source electrode of P type MOS transistor 110. Precharging unit 101 also has a P type MOS transistor 110 having a source electrode connected to the drain electrode of P type MOS transistor 108, a gate electrode connected in common to a gate electrode of an N type MOS transistor 111 and data bus line DOUTB, and a drain electrode connected to a drain electrode of N type MOS transistor 111, N type MOS transistor 11 has a drain electrode connected to the drain electrode of the P type MOS transistor 110, a gate electrode connected to the gate electrode of P type MOS transistor 110, and a source electrode connected to a drain electrode of an N type MOS transistor 112.

In addition, precharging unit 101 includes N type MOS transistor 112 having a drain electrode connected to the source electrode of N type MOS transistor 111, a gate electrode connected in common to a control terminal P2 and to an input terminal of an inverter 109, and a source electrode connected to a common electric potential.

Inverter 109 of precharging circuit 101 has an input terminal connected in common to the gate electrode of the N type MOS transistor 112 and to control terminal P2, and the output terminal of inverter 109 connected to the gate electrode of the P type MOS transistor 108.

Output buffer unit 102 of the conventional readout circuit shown in FIG. 1 includes an inverter 113 having an input terminal connected to an input terminal of an inverter 115 and data bus line DOUTB. Inverter 114 inverts an output signal from inverter 113 which supplies an output to the gate of P type MOS transistor 117. The source electrode of PMOS transistor 117 is connected to a power supply voltage and a drain electrode is connected to a drain electrode of N type MOS transistor 118.

Output buffer unit 102 further includes inverter 115 having an input terminal connected in common to the input terminal of the inverter 113 and the data bus line DOUTB, which is the output terminal of the precharging unit 101. Inverter 116 receives the output of inverter 115 to supply a complementary output to the gate of N type MOS transistor 118, which has a drain electrode connected to the drain electrode of the P type MOS transistor 117 and a source electrode connected to ground. Output node DQ of output buffer 102 is connected to the drain electrode of P type MOS transistor 117 and N type MOS transistor 118. Further, node DQ is connected to a load condenser 119.

The following description relates to the operation of the conventional data read circuit shown in FIG. 1.

When power is applied to the memory, but no memory cell has been designated for a data read, low and high voltages are respectively applied to control terminal P1 and control terminal P2. Accordingly, the potential of node A, the output of precharging unit 101, is set to Vcc/2 and inverting unit 100 is disabled.

Figures 3A, 3B, 3C:
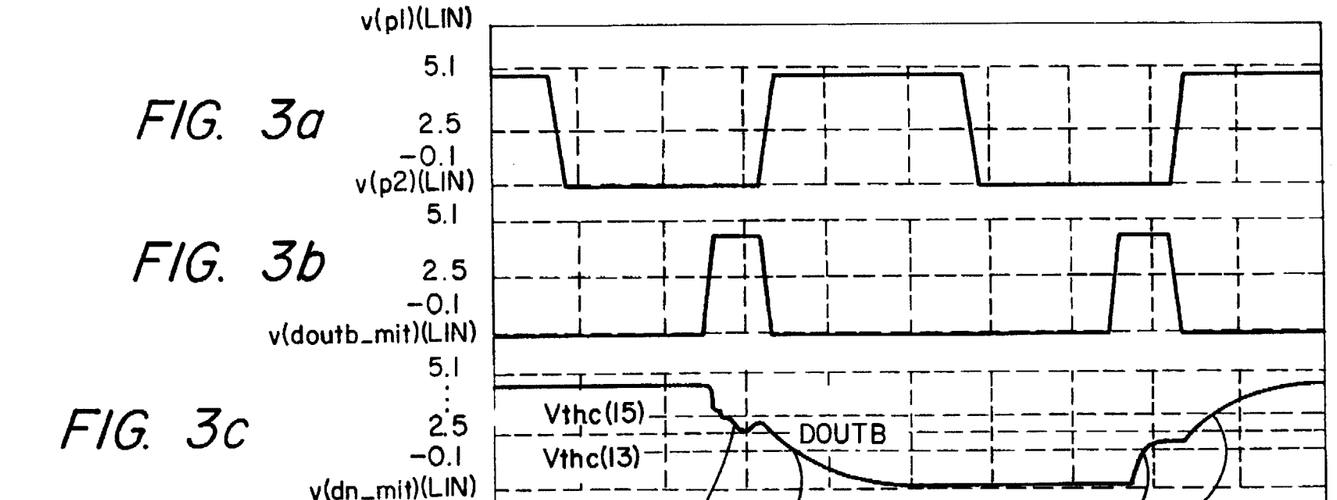
FIG. 3A shows a waveform of a pulse signal applied to a control terminal P1 of an inverting unit in accordance with the present invention.
FIG. 3B shows a waveform of a pulse signal applied to a control terminal P2 of a precharging unit in accordance with the present invention.
FIG. 3C, shows a waveform of a data signal from an output terminal of the inverting unit of FIG. 3A.

Control terminal P1, on the other hand, serves as a terminal to enable or disable inverting unit 100. At the time the power is applied, as control terminal P2 is activated by transitioning from low to high, node A is precharged to Vcc/2. Inverter 113 receives the precharge potential Vcc/2, as shown in FIG. 3C, and outputs a logic low because it is designed to have a threshold voltage lower than the precharge potential. Accordingly, inverter 113 recognizes the voltage of Vcc/2 as a high electric potential and therefore outputs the logic low.

Inverter 114 receives the logic low, inverts it and supplies a complementary output to the gate electrode of P type MOS transistor 117. Inverter 115, which receives the precharge potential VCC/2, is designed to have a higher threshold voltage than the precharge potential. Accordingly, inverter 115 recognizes the Vcc/2 voltage as a low and therefore outputs a high level signal.

Each of inverters 13 and 15 has a different threshold voltage, and inverter 116 that receives the high output of the inverter 115, inverts the received signal and applies it to the gate electrode of N type MOS transistor 118.

Accordingly, the MOS transistors 117 and 118 are both turned off, and an output terminal DQ is neither high nor low, but floats. When a relative cell aligned for data read is not selected after power is applied to the memory, the output terminal DQ is in a high-impedance or floating state. The above four inverters 113, 114, 115 and 116 are used for amplifying current to provide sufficient current required for driving relatively large P type MOS transistor 117 and N type MOS transistor 118.

Figures 3D, 3E:
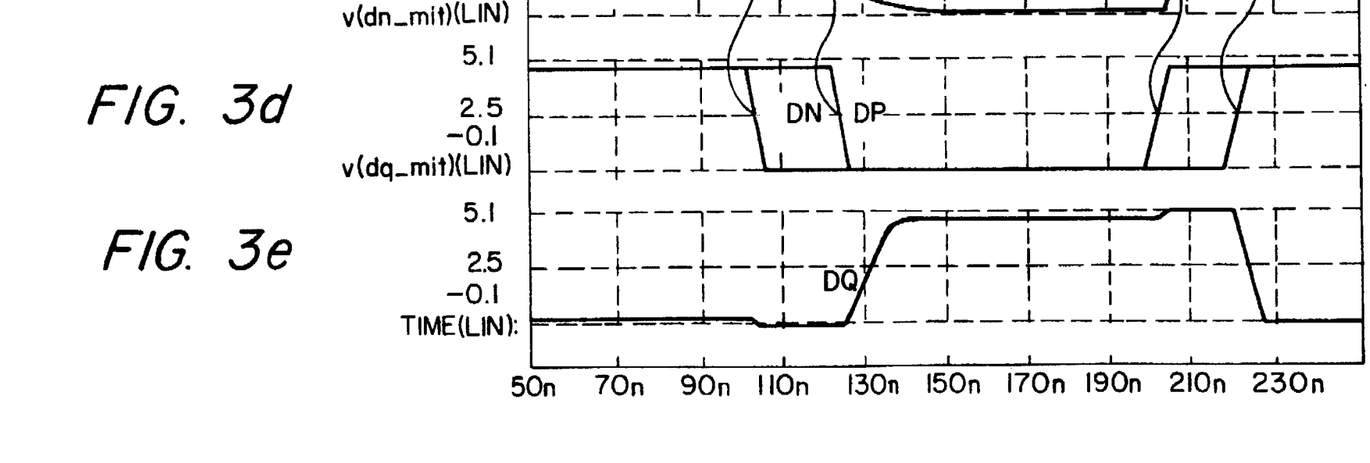
FIG. 3D shows a waveform of a data signal applied to the control terminal of an output buffer unit.
FIG. 3E shows a waveform of a data signal produced from an output terminal of the output buffer unit.

When the memory is placed into a READ mode, one of the memory cells is selected in accordance with a unique address combination. One bit of data from the selected memory cell is amplified by the sense amplifier (not illustrated) and supplied to the terminal (SOUT) of the read circuit shown in FIG. 1. Further, as shown in FIG. 3A, as soon as the potential of control terminal P1 of the inverting unit 100 transitions from low to high, the inverting unit 100 is enabled, and the data bit at SOUT is phase-inverted and output at node A. The data bit has either a high or low electric potential, depending on its value relative to the reference precharge potential Vcc/2 at node A (DOUTB). In the precharging unit 101, the control terminal P2 transitions from a high to low, thereby disabling precharging unit 101. Since the addressed one data bit output from the inverting unit 100 changes to a high or low level based on its level relative to the precharge potential at node A, the conversion speed is higher than the speed at which the data changes to a high or low level relative to a reference potential, i.e., a potential of 0V. The timing chart for generating an output at output terminal DQ of the memory is shown in FIG. 3E.

The addressed one bit data produced from the output terminal SOUT of the sense amplifier is inverted and output to the output terminal DOUTB of the inverting unit 100, and the output data bit has an output waveform that swings up and down depending on its potential relative to Vcc/2. The one bit data is amplified and inverted by the output buffer unit 102. Accordingly, relative data is amplified and inverted by the output buffer unit 102 so that relative data, i.e. data output on the basis of the comparison to Vcc/2, is supplied to output terminal DQ of the memory.

The conventional data read circuit, however, has a relatively long access time when resistance and conductance in a line is increased due to increased integration, even though the speed for outputting data by means of the precharging unit is improved. The conventional data read circuit also has a problem that the access time grows longer by delays associated with inverters having different threshold voltages.

SUMMARY OF THE INVENTION

The present invention is intended to overcome the above-described disadvantage of conventional data read circuits.

It is an object of the present invention to provide a data read circuit of a memory adequate for the improvement in the access time by reducing the delay that may occur in a read mode of the memory due to the increase of resistance and conductance in a line resulting from increased integration.

In accordance with the present invention, a data read circuit of a memory includes an inverting unit for receiving data produced from a sense amplifier thereby inverting and outputting the received data. A precharging unit is also provided for precharging a data bus line end an output terminal of the inverting unit to Vcc/2. A first amplifying unit is included for receiving and amplifying the signal produced from the inverting unit, and a second amplifying unit is connected in common to an input terminal of the first amplifying unit to receive and amplify the signal produced from the inverting unit. An output buffer is also provided that receives and inverts the signal amplified by the first and second amplifying units.

BRIEF DESCRIPTION OF THE DRAWINGS

The above object and other advantage of the present invention will become more apparent by describing in detail the preferred embodiments of the present invention with reference to the attached drawings in which:

FIG. 3A to 3E are waveforms of the data read circuit of FIG. 2;

FIGS. 4A to 4F depict waveforms at various nodes in the circuit shown in FIG. 2;

DETAILED DESCRIPTION OF THE INVENTION

A preferred embodiment of a data read circuit of the present invention will now be described in detail with reference to the accompanying drawings.

Figure 2:
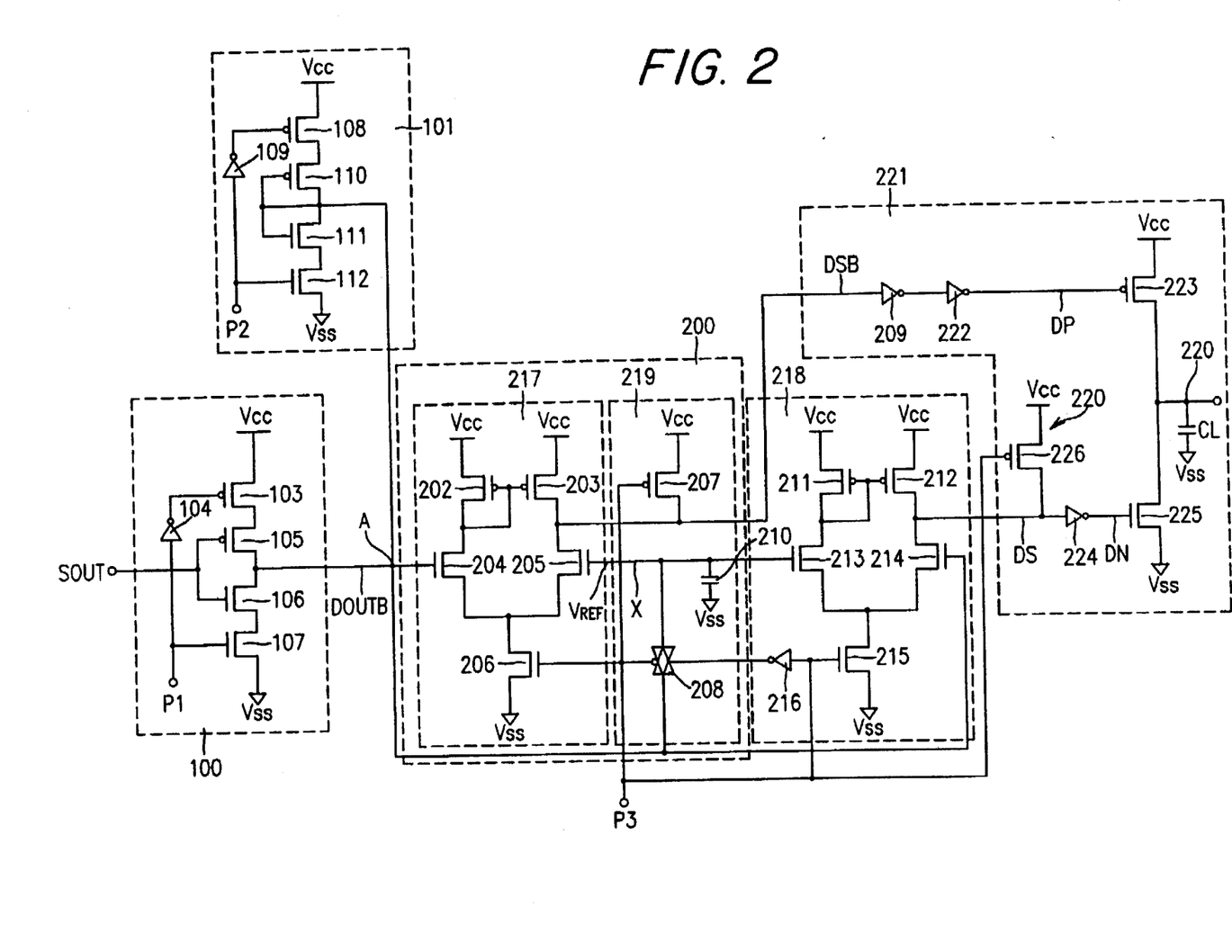
FIG. 2 is a schematic block diagram in accordance with a preferred embodiment of a data read circuit of the present invention.

FIG. 2 is a schematic block diagram in accordance with a preferred embodiment of a data read circuit of the present invention.

The inventive data read circuit includes an inverting unit 100 for receiving data produced from a sense amplifier to invert and produce the data by the control of a control terminal P1, A precharging unit 101 receives the data produced from the inverting unit 100 and precharges a data bus line DOUTB to power voltage Vcc/2 upon application of a signal control at terminal P2. Further, a first amplifying unit 200 receives and amplifies the data produced from the inverting unit 100.

The above described data read circuit of the present invention further includes a second amplifying unit 201 having an input terminal connected in common to an input terminal of the first amplifying unit 200 to receive and amplify the data produced from the inverting unit 100. In addition, an output buffer unit 221 is provided for receiving the signals produced from the first and second amplifying units 200 and 201 to invert and amplify the signals. Inverting unit 100 and precharging unit 101 are similar to inverting unit 100 and precharging unit 101 discussed above. Accordingly, further description of these circuits will be omitted.

The first amplifying unit 200 includes a first differential amplifying unit 217 for receiving the signal produced from the inverting unit 100 to amplify and produce the difference between the received signal and a reference voltage $V_{REF}$ applied to a reference voltage terminal (node X). Moreover, a first high-level charging unit 219 sense the signal produced from the first differential amplifying unit 217 more rapidly, and supplies the signal to an output bluffer unit 221.

The second amplifying unit 201 includes a second differential amplifying unit 218 for receiving the signal produced from the inverting unit 100 and amplifying the difference between the received signal and the reference voltage $V_{REF}$ applied to the reference voltage terminal. Further, a second high level charging unit 220 senses the signal produced from the second differential amplifying unit 218 more rapidly to supply the signal to an output buffer unit 221.

The output buffer unit 221 includes an inverter 209 that inverts the signal produced from the first differential amplifying unit 217, and an inverter 222 inverts the signal produced from the inverter 209. A P type MOS transistor 223 is also provided having a source electrode connected to the power supply voltage Vcc, a gate electrode connected to an output terminal DP of inverter 222, and a drain electrode connected to a drain electrode of an N type MOS transistor 225.

The output buffer unit 221 further includes an inverter 224 for receiving the signal produced from an output terminal DS of second differential amplifying unit 218. An N type MOS transistor 225 is also provided having a gate electrode connected to the drain electrode of the P type MOS transistor 223, and a source electrode connected to a ground potential. Further, a load condenser 227 has one electrode connected to the drains of P type MOS transistor 223 and N type MOS transistor 225, and another electrode connected to ground.

The first differential amplifying unit 217 includes a P type MOS transistor 202 having a source electrode receiving power supply voltage Vcc, a gate electrode connected to its drain and a gate electrode of a P type MOS transistor 203. N type MOS transistor 204 of differential amplifying unit 217 includes a drain electrode connected to the drain electrode of P type MOS transistor 202, a gate electrode connected to output terminal DOUTB of the precharging unit 101, and a source connected to a source electrode of the N type MOS transistor 205, as well as the drain electrode of an N type MOS transistor 206. In addition, P type MOS transistor 203 has a source electrode connected to power supply Vcc, a gate electrode connected to the gate electrode of the P type MOS transistor 202, and a drain electrode connected to a drain electrode of an N type MOS transistor 205.

The first differential amplifying unit 217 further includes N type MOS transistor 205 having its drain electrode connected to the drain electrode of the P type MOS transistor 203, a gate electrode connected to one side of a transmission gate 208, and the source electrode connected to the source electrode of the N type MOS transistor 204, as well as the drain electrode of the N type MOS transistor 206. N type MOS transistor 206 has a drain electrode connected in common with the source electrodes of the N type MOS transistors 204 and 205, a gate electrode connected to a low-level control terminal of the transmission gate 208 of the first high-level charging unit 219, and a source electrode connected to ground.

The first high-level charging unit 219 includes a P type MOS transistor 207 having a source electrode connected to Vcc, a gate electrode connected in common to a control terminal P3 and the low-level control terminal of the transmission gate 208, and a drain electrode connected in common to the drain electrode of the P type MOS transistor 203 and the input terminal DSB of the inverter 209. Transmission gate 208 has one side connected to node X, and the other side connected to the output terminal DOUTB of the precharging unit 101. The low-level control terminal of transmission gate 208 is connected to the gate electrode of the N type MOS transistor 206 of the first differential amplifying unit 101, and a high-level control terminal is connected to an output terminal of an inverter 216 of the second amplifying unit 201. Further, a condenser 210 is provided having one electrode connected to node X and the other electrode connected to the common electric potential or ground.

The second differential amplifying unit 218 includes a P type MOS transistor 211 having a source electrode connected to Vcc and a gate electrode connected to a gate electrode of a P type MOS transistor 212, as well as its own drain electrode. N type MOS transistor 213 is also included having a drain electrode connected to the drain electrode of P type MOS transistor 211, a gate electrode connected to node X, and a source electrode connected to a source electrode of N type MOS transistor 214, as well as a drain electrode of an N type MOS transistor 215. Further, P type MOS transistor 212 has a source electrode connected to Vcc, a gate electrode connected to the gate electrode of P type MOS transistor 211, and a drain electrode connected to a drain electrode of N type MOS transistor 214.

In addition, the second differential amplifying unit 218 includes N type MOS transistor 214 having a drain electrode connected to the drain electrode of P type MOS transistor 212, a gate electrode connected to one side of the transmission gate 208, as well as the output terminal DOUTB of the precharging unit 101. In addition, the source electrode of transistor 214 is connected to the source electrode of N type MOS transistor 213 and a drain electrode of the N type MOS transistor 215. N type MOS transistor 215 has its drain electrode commonly connected to the source electrodes of the N type MOS transistors 213 and 214, a gate electrode connected to an input terminal of an inverter 216 and control terminal P3, and a source electrode connected to ground. Inverter 216 has an input terminal connected in common to the control terminal P3 and the gate electrode of the N type MOS transistor 215, and an output terminal of inverter 216 is connected to the high-level control terminal of the transmission gate 208.

The second high level charging unit 220 includes a P type MOS transistor 226 having a source electrode connected to Vcc, a gate electrode commonly connected to: (1) control terminal P3, (2) the gate electrode of the N type MOS transistor 215 and (3) the input terminal of the inverter 216, and a drain electrode commonly connected to: (1) the drain electrode (DS terminal) of the P type MOS transistor 212 and (2) the input terminal of the inverter 224.

The operation of the data read circuit in accordance with the present invention will now be described.

Figures 4A, 4B, 4C:
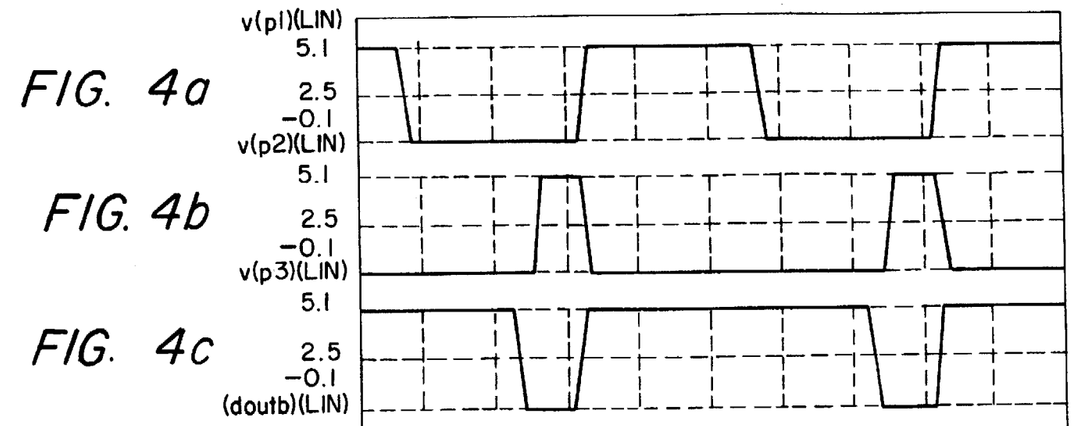
FIG. 4A shows a waveform of the pulse signal applied to the control terminal P1 of the inverting unit in accordance with the present invention.
FIG. 4B shows a waveform of the pulse signal applied to the control terminal P2 of the precharging unit in accordance with the present invention.
FIG. 4C shows a wave form of a data signal applied to control terminals of first and second amplifying units.

When power is applied to the memory, the control terminal P3 attains a high level as shown in FIG. 4C, and creates an initial state in which the transmission gate 208 is enabled to precharge the gate of N type MOS transistor 205 and node X to Vcc/2.

When a memory cell is addressed during the initial state, inverting unit 100 is enabled by a pulse signal applied to the control terminal P1, as shown in FIG. 4A, and the precharging unit 101 is disabled by a pulse signal applied to the control terminal P2, as shown in FIG. 4B. Accordingly, the signal produced from the sense amplifier is applied to node A, and it is either high or low depending on its potential relative to the precharge voltage.

As the control terminal P3, as shown in FIG. 4C, changes from low to high, the transmission gate 208 is turned off, and the N type MOS transistors 206 and 215 are turned on to operate the first and second differential amplifying units 217 and 218. P type MOS transistor 207 of the first high-level charging unit 219 and P type MOS transistor 226 of the second high level charging unit 220 are therefore turned off.

Figure 4D:
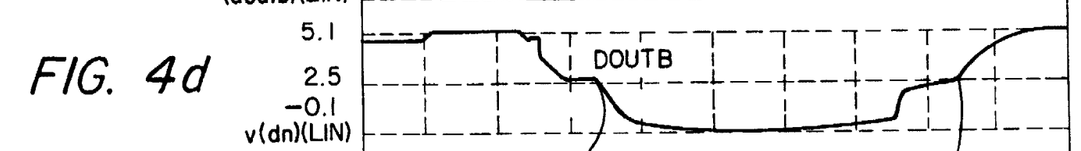
FIG. 4D shows a waveform of a data signal produced from the output terminal of the inverting unit of FIG. 4A.

One data bit (DOUTB shown in FIG. 4D) produced from fie sense amplifier is applied to the gate electrode of N type MOS transistor 204 of the first amplifying unit 200 and the gate electrode of the N type MOS transistor 214 of the second amplifying unit 201. The precharge voltage is applied to node X and is used as a reference voltage ($V_{REF}$) for the first and second differential amplifying units 217 and 218.

When the data bit is applied to the gate electrode of N type MOS transistor 204 is high, the amplified output voltage is supplied to the drain electrode of P type MOS transistor 203 as a result of the operation of a current-mirror type differential amplifier. Thus, the voltage is converted more rapidly by combining this output voltage and the high voltage that was applied to the first high-level charging unit 219, and the result is transmitted to the output buffer unit 221.

Figures 4E, 4F:
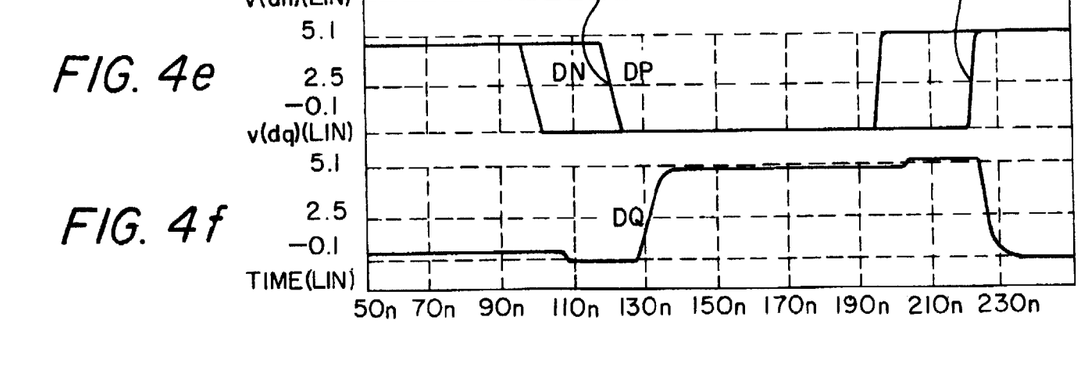
FIG. 4E shows a waveform of the data signal applied to the control terminal of the output buffer unit.
FIG. 4F shows a waveform of the data signal produced from the output terminal of the output buffer unit.

In addition, when a high voltage is applied to the gate electrode of the N type MOS transistor 214 of the second amplifying unit 201, the second differential amplifying unit 218 operates so that the high-level output voltage from the drain electrode of P type MOS transistor 212, i.e., the output terminal DS, is output to the output buffer unit 221. Accordingly, the voltage is supplied to output terminal DQ more rapidly (see FIG. 4F).

Figure 5:
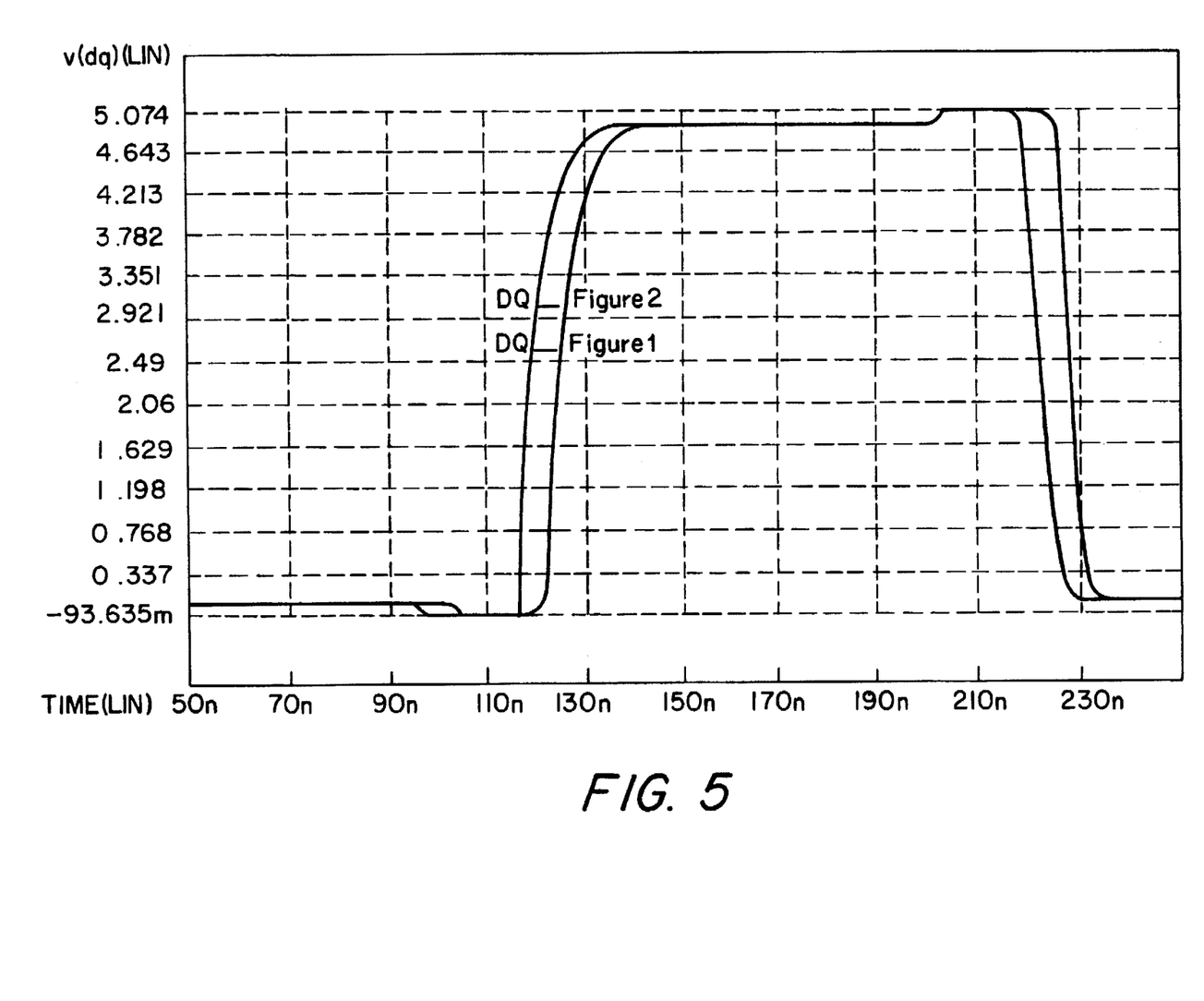
FIG. 5 is an output timing chart comparing performance of the conventional data read circuit and the data read circuit in accordance with the present invention.

FIG. 5 is an output timing chart for comparison of a conventional data read circuit and the data read circuit in accordance with the present invention. In FIG. 5, the solid line refers to the output of the conventional read circuit and the dotted line to the output of the read circuit in accordance with the present invention.

Referring to FIG. 5, the time required to reach the high voltage level is more than 10 ns faster than the conventional circuit. As discussed above, this is because data addressed by the first and second amplifying units is sensed at a higher speed, and is then supplied to the output terminal DQ of the memory.

Accordingly, the present invention attains improved speed for outputting the addressed data by reducing the delay that may occur in the read mode of the memory due to increases of resistance and conductance.

While this invention has been described in connection with what is presently considered to be the most practical and preferred embodiments, it is to be understood that the invention is not limited to the disclosed embodiments, but, on the contrary, it is intended to cover various modifications and equivalent arrangements included within the spirit and scope of the appended claims.

What is claimed is:

1. A data read circuit of a memory comprising:
   an inverting unit having an input and an output, said input receiving data;
   a precharging unit precharging a data bus line coupled to said output of said inverting unit to substantially one half a power supply voltage;
   a first amplifying unit coupled to said output of said inverting unit to amplify said output of said inverting unit, said first amplifying unit having an output;
   a second amplifying unit coupled to said input of said inverting unit to amplify said output from said inverting unit, said second amplifying unit having an output; and
   an output buffer unit coupled to invert and amplify said outputs of said first and second amplifying units.

2. A data read circuit of a memory as set forth in claim 1, wherein said first amplifying unit includes:
   a first differential amplifying unit receiving said data from said inverting unit; and
   a first high-level charging unit for shifting a level of the signal produced from said first differential amplifying unit to a high level.

3. A data read circuit of a memory as set forth in claim 1, wherein said first amplifying unit includes a differential amplifier.

4. A data read circuit in accordance with claim 3, wherein said differential amplifying unit includes a current-mirror differential amplifier including a plurality of P type MOS transistors and N type MOS transistors.

5. A data read circuit of a memory as set forth in claim 4, wherein said second amplifying circuit includes a N type MOS transistor, said output buffer unit includes an inverter, and said first high-level charging unit includes:
   a control terminal;
   a transmission gate having an input and an output coupled to an output of said precharging unit, said transmission gate also having a low-level control terminal coupled to a gate electrode of said N type MOS transistor of said second amplifying circuit;
   a P type MOS transistor having a source electrode connected to a power supply, a gate electrode connected to said control terminal and said low-level control terminal of said transmission gate, and a drain electrode of one of said plurality of P type MOS transistors of said differential amplifier unit included in said first amplifying unit and an input terminal of said inverter included in said output buffer unit; and
   a condenser having a first electrode connected to said input of said transmission gate and a second electrode connected to a reference potential.

6. A data read circuit of a memory as set forth in claim 1, wherein said second amplifying unit includes:
   a second differential amplifying unit coupled to said output of said inverting unit, said second differential amplifying unit amplifying and outputting a signal corresponding to a difference between the output of said inverting unit and a reference voltage applied to a reference voltage terminal; and
   a second high-level charging unit for sensing said signal output from the second differential amplifying unit and transmitting said signal output from the second differential amplifying unit.

7. A data read circuit of a memory as set forth in claim 6, wherein said second differential amplifying unit includes a current-mirror type differential amplifier including a plurality of P type MOS transistors and N type MOS transistors.

8. A data read circuit in accordance with claim 6, wherein said second amplifying unit includes a first inverter, said output buffer unit includes a second inverter, and said second high-level charging unit includes:
   a control terminal; and
   a P type MOS transistor having a source electrode connected to a power supply, a gate electrode connected to a gate electrode of an N type MOS transistor included in said second amplifying unit and an input terminal of said first inverter, and a drain electrode of one of said plurality of P type MOS transistors of said second differential amplifying unit included in said second amplifying unit and an input terminal of said second inverter included in said output buffer unit.

9. A data read circuit of a memory, comprising:

an inverting unit having an input and an output, said input receiving data;

a precharging unit precharging a data bus line coupled to said output of said inverting unit to substantially one half a power supply voltage;

a first amplifying unit coupled to said output of said inverting unit to differentially amplify said output of said inverting unit, said first amplifying unit having an output;

a second amplifying unit coupled to said output of said inverting unit to differentially amplify said output of said inverting unit, said second amplifying unit having an output; and an output buffer unit coupled to invert and amplify said outputs of said first and second amplifying units.

\* \* \* \* \*